(12) United States Patent
Tani et al.

(10) Patent No.: US 7,220,638 B2
(45) Date of Patent: May 22, 2007

(54) METHOD FOR FABRICATING SEMICONDUCTOR DEVICE

(75) Inventors: Kouichi Tani, Tokyo (JP); Osamu Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 276 days.

(21) Appl. No.: 10/882,357

(22) Filed: Jul. 2, 2004

(65) Prior Publication Data
US 2005/0014339 A1    Jan. 20, 2005

(30) Foreign Application Priority Data
Jul. 17, 2003    (JP)    ............................ 2003-198333

(51) Int. Cl.
    *H01L 21/8238*    (2006.01)
(52) U.S. Cl. .................... 438/233; 438/286; 438/586
(58) Field of Classification Search ............. 438/233, 438/286, 586
    See application file for complete search history.

(56) References Cited
U.S. PATENT DOCUMENTS
5,338,986 A    8/1994    Kurimoto ............... 327/566
6,004,838 A *  12/1999   Ma et al. ................ 438/200
2004/0041228 A1*  3/2004   Houston ................. 257/500

FOREIGN PATENT DOCUMENTS
JP    5-335500    12/1993

OTHER PUBLICATIONS
Wolf, Stanley, "Isolation Technologies for Integrated Circuits," Silicon Processing for the VLSI Era—vol. 2: Process Integration, Lattice Press, Jan. 1990, pp. 66-78.*

* cited by examiner

*Primary Examiner*—Rexford Barnie
*Assistant Examiner*—Toniae M. Thomas
(74) *Attorney, Agent, or Firm*—Rabin & Berdo, PC (57) ABSTRACT

A method for fabricating a semiconductor device in which plural transistors including a first transistor and a second transistor are integrated includes a first step for forming the first transistor such that a distance between a drain contact and a gate electrode of the first transistor is a first distance, and a second step for forming the second transistor such that a distance between a drain contact and a gate electrode of the second transistor is a second distance larger than the first distance.

12 Claims, 10 Drawing Sheets

METHOD FOR FABRICATING SEMICONDUCTOR DEVICE

BACKGROUND OF THE INVENTION

1. Field of the Invention

The present invention relates to a method for fabricating a semiconductor device and the semiconductor device, and particularly, relates to a method for fabricating a semiconductor device in which plural transistors are integrated and the semiconductor device.

2. Description of the Related Art

Recently, as systems are diversified, a semiconductor device such as system LSI in which a digital circuit and an analog circuit are integrated in one chip is practically used. In such a semiconductor device, since the digital circuit in which reduction of leakage current during off period is primarily considered and the analog circuit in which current-driven capability is primarily considered are integrated, a threshold voltage that is the conduction starting voltage of a transistor must be changed between the digital and analog circuits. The threshold voltage is generally controlled in a chip by changing the density of impurity implantations into a diffusion region for each threshold voltage.

Alternatively, as an example of methods for changing the conduction starting voltage of the transistor, there is a CMOS transistor described in JP-A-5-335500 (FIGS. 1, 4 on pp. 3–4). In the CMOS transistor, a distance between a source contact and a gate electrode is made to be longer than a distance between a drain contact and the gate electrode in a P-type or N-type transistor or both, and a series resistance is added to the source side, thereby a parasitic transistor is made to be not connected even in the case where the same drain voltage is applied.

In the fabrication method in which the density of the impurity implantation density is changed for each threshold voltage, since a mask for ion implantation must be prepared for each threshold voltage, there is a fear of cost increases due to an increased number of the masks. Moreover, ion implantation is required for each of P-channel and N-channel. Therefore, when the threshold voltage increases, the number of the ion implantations is twice as many as the number of the increased threshold voltages is required, and thus fabrication processes increase, and there is fear of an increase of fabrication time and cost.

On the other hand, in the method described in JP-A-5-335500, the drain voltage which causes conduction of the parasitic transistor may be considered to be changed in the CMOS transistor. However, the method described in JP-A-5-335500, which is a method of preventing a positive feedback to the parasitic transistor by confining current flow into the parasitic transistor, does not change the threshold voltage of the CMOS transistor itself. In addition, when the series resistance is inserted into the source side as described in JP-A-5-335500, there is a problem that the threshold voltage increases, resulting in a decrease in operation velocity.

SUMMARY OF THE INVENTION

The invention aims to reduce the fabrication time and cost by simplifying the control of the threshold voltage of transistors in the method for fabricating the semiconductor device.

The method for fabricating the semiconductor device according to the invention, which is a method for fabricating a semiconductor device in which plural transistors including a first transistor and a second transistor are integrated, includes a first step and a second step. In the first step, the first transistor is formed such that a distance between a drain contact and gate electrode of the first transistor is a first distance. In the second step, the second transistor is formed such that a distance between a drain contact and gate electrode of the second transistor is a second distance larger than the first distance.

In the method for fabricating the semiconductor device according to the invention, the second distance between the drain contact and gate electrode of the second transistor is larger than the first distance between the drain contact and gate electrode of the first transistor, thereby threshold voltage of the second transistor is controlled to be lower than threshold voltage of the first transistor. This makes it unnecessary to prepare the mask for each threshold voltage and perform the impurity implantation to control the threshold, and makes it possible to control the threshold voltage easily, and reduces fabrication time and cost of the semiconductor device.

The semiconductor device in the invention is a semiconductor device, in which plural transistors are integrated, having the first transistor in which the distance between the drain contact and the gate electrode is the first distance, and the second transistor in which the distance between the drain contact and the gate electrode is the second distance larger than the first distance.

The semiconductor device in the invention is a semiconductor device, in which a distance between a source contact and the gate electrode of the first transistor is a third distance, and a distance between a source contact and the gate electrode of the second transistor is a fourth distance larger than the third distance.

The semiconductor device in the invention is a semiconductor device, in which the first and the third distances are almost equal in the first transistor, and the second and the third distances are almost equal in the second transistor.

The semiconductor device in the invention is a semiconductor device, in which the first and the second transistors are MOS transistors having surfaces of the source and drain regions which were made to be silicide.

The semiconductor device in the invention is a semiconductor device, in which the first and the second transistors are formed in a semiconductor layer on an SOI substrate.

The semiconductor device in the invention is a semiconductor memory device, in which each of the first and the second transistors is a transistor forming a memory cell.

The semiconductor device in the invention is a semiconductor device, in which the first and the second transistors are arranged on different columns.

The semiconductor device in the invention is a semiconductor device, in which the first and the second transistors are arranged on the same column.

The semiconductor device in the invention is a semiconductor device having the digital and the analog circuits, in which the first and the second transistors are contained in the digital and the analog circuits, respectively.

DETAILED DESCRIPTION OF THE PREFERRED EMBODIMENTS (1) First Embodiment

FIG. 1 to FIG. 7 show a method for fabricating a semiconductor device according to the first embodiment of the invention. Here, a method for fabricating system LSI in which the digital and the analog circuits are integrated in one chip is described as an example. The semiconductor device is formed by integrating plural MOSFETs (Metal-Oxide-Semiconductor Field Effect Transistor) on an SOI (Silicon On Insulator) substrate.

Figure 1:
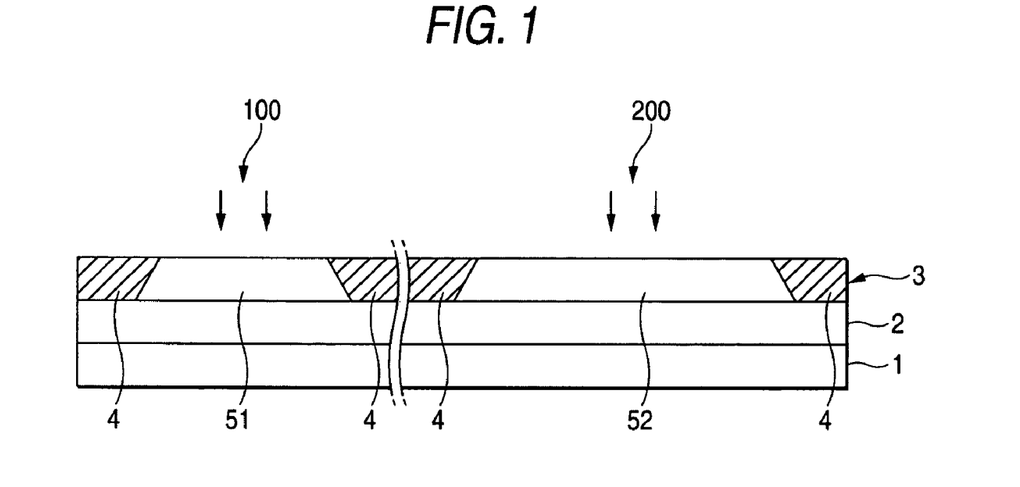
FIG. 1 shows a fabrication process A of a semiconductor device according to the first embodiment.

The SOI substrate according to the embodiment comprises a supporting substrate 1 made of silicon, a buried insulating film 2 made of silicon dioxide $SiO_2$, and a semiconductor layer 3 formed through the buried insulating film 2. A digital region 100 forming the digital circuit and an analog region 200 forming an analog circuit are formed on the semiconductor layer 3. First, as shown in FIG. 1, a field insulating film 4 made of $SiO_2$ is formed on the semiconductor layer 3 using a LOCOS (Local Oxidation of Silicon) technique or the like, and active regions 51 and 52 are formed in the digital region 100 and the analog region 200, respectively. The first transistor Tr1 forming the digital circuit is formed in the active region 51, and the second transistor Tr2 forming the analog circuit is formed in the active region 52. Here, the first and the second transistors Tr1 and Tr2 are formed such that the threshold voltage Vt2 of the second transistor Tr2 is lower than the threshold voltage Vt1 of the first transistor Tr1. the active region 52. Here, the first and the second transistors Tr1 and Tr2 are formed such that the threshold voltage Vt2 of the second transistor Tr2 is lower than the threshold voltage Vt1 of the first transistor Tr1.

Subsequently, to control the threshold voltage, ion implantation of an N-type or a P-type impurity (for example, phosphor P as the N-type impurity and boron B as the P-type impurity) is selectively performed into the N-type and the P-type regions, which are then activated through heat treatment. The N-type impurity density and the P-type impurity density for controlling the threshold are made to be same between the first transistor Tr1 and the second transistor Tr2. Although the threshold voltage Vt is different between the first transistor Tr1 and the second transistor Tr2 in the embodiment, since the ion implantation is not performed with the impurity density being changed for each of the threshold voltages Vt1 and Vt2, and the threshold voltage Vt is controlled by changing the drain contact distance ld which will be described later, here, ion implantation of the impurity for controlling the threshold voltage is performed in an almost same density into each of the first and the second transistors Tr1 and Tr2 having a different threshold voltage Vt.

Figure 2:
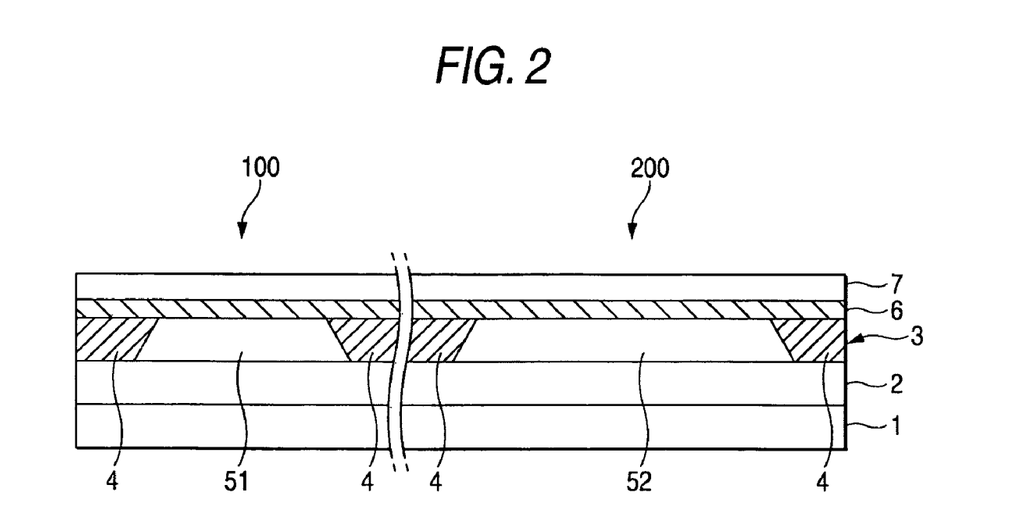
FIG. 2 shows a fabrication process B of the semiconductor device according to the first embodiment.
Figure 3:
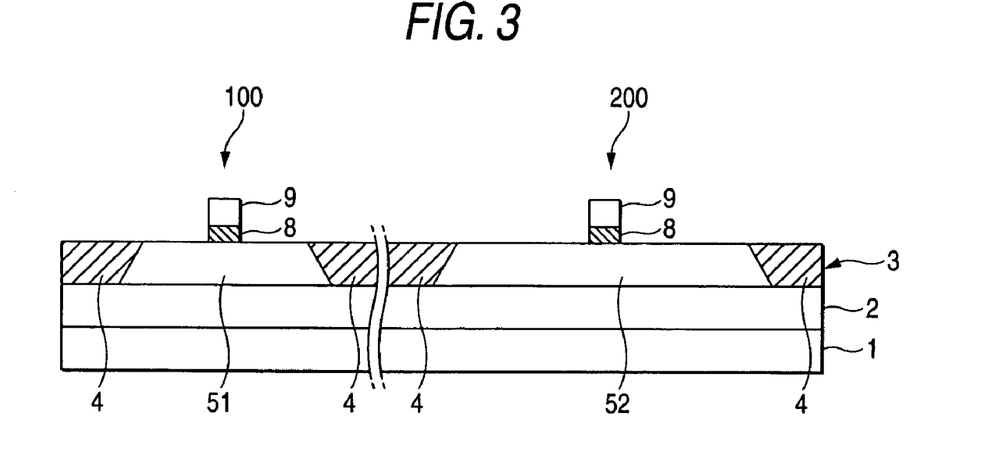
FIG. 3 shows a fabrication process C of the semiconductor device according to the first embodiment.
Figure 4:
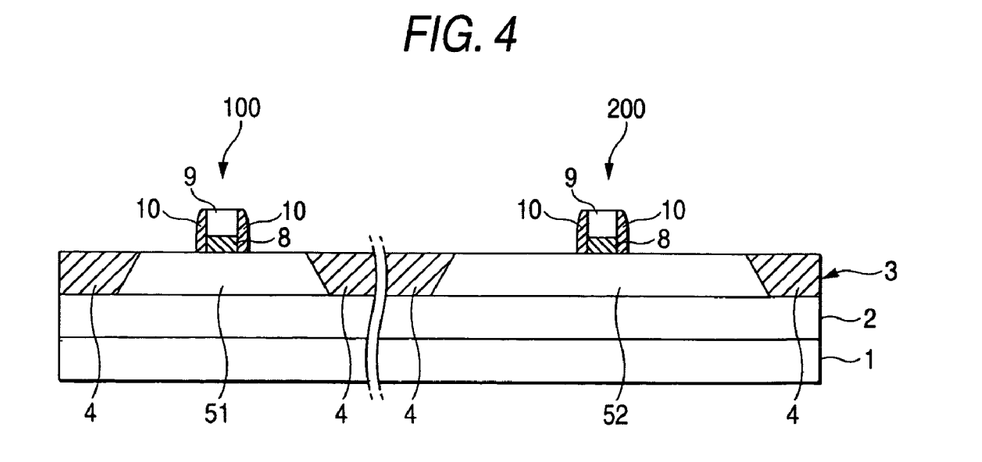
FIG. 4 shows a fabrication process D of the semiconductor device according to the first embodiment.

Next, as shown in FIG. 2, an insulating film 6 made of $SiO_2$ and a polycrystalline silicon layer 7 are deposited in order, then a region forming a gate electrode 8 is masked using the photolithography technique, then the insulating film 6 and the polycrystalline silicon layer 7 are etched using, for example, RIE (Reactive Ion Etching), and the gate insulating film 8 and a gate electrode 9 are formed as shown in FIG. 3. Successively, a silicon dioxide ($SiO_2$) film or silicon nitride ($Si_3N_4$) film are deposited using CVD method and subjected to the anisotropic etching, thereby a sidewall 10 is formed as shown in FIG. 4.

Figure 5:
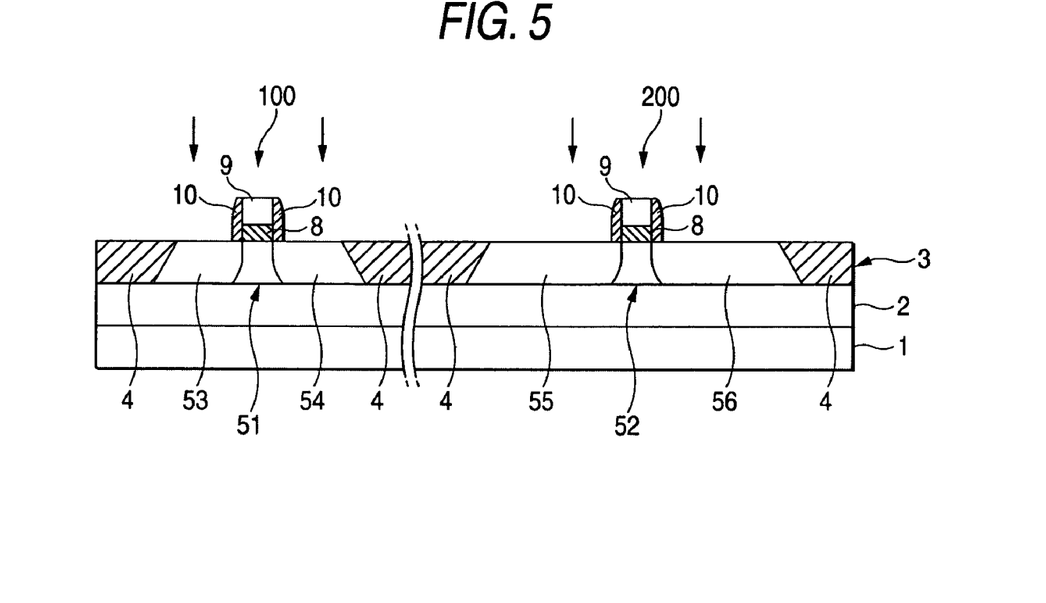
FIG. 5 shows a fabrication process E of the semiconductor device according to the first embodiment.
Figure 6:
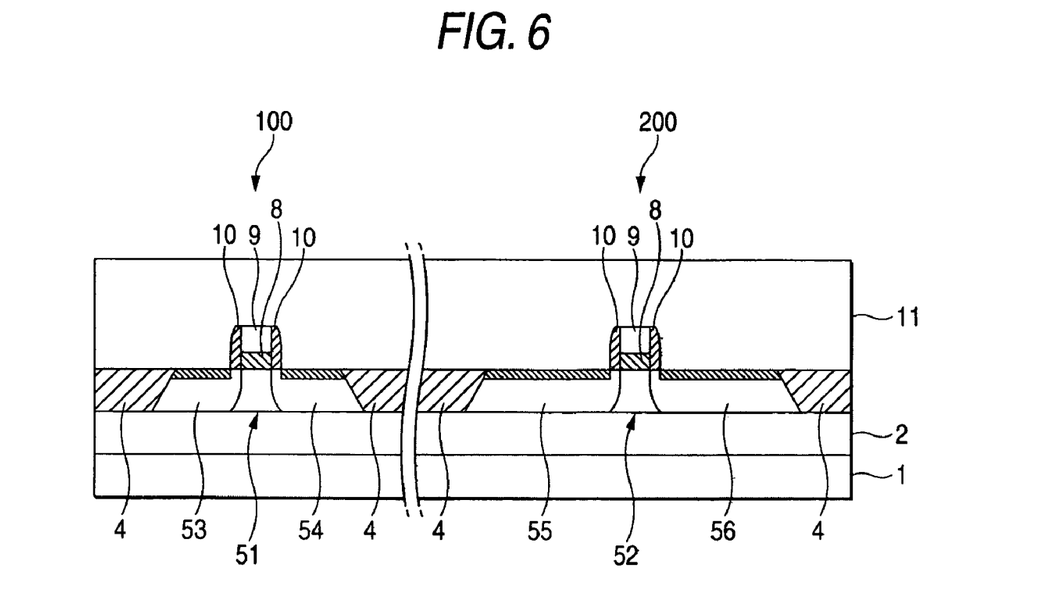
FIG. 6 shows a fabrication process F of the semiconductor device according to the first embodiment.

Next, as shown in FIG. 5, implantation of the P-type or N-type impurity (for example, arsenide As as the N-type impurity and boron B as the P-type impurity) is performed into the active regions 51 and 52, and a source region 53 and a drain region 54 are formed in the active region 51, and a source region 55 and a drain region 56 are formed in the active region 52. Then, as shown in FIG. 6, surfaces of the source region 53 and the drain region 54 and surfaces of the source region 55 and the drain region 56 are formed of silicide using cobalt Co or titanium Ti, and then an interlayer insulating film 11 made of $SiO_2$ or $Si_3N_4$ is formed using the CVD method.

Figure 7:
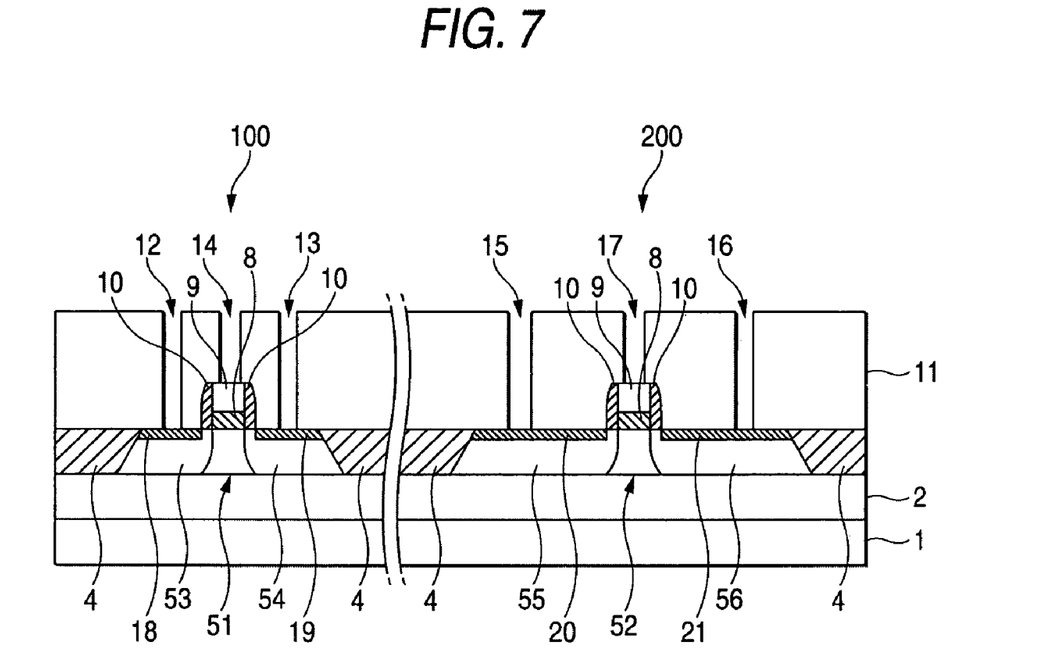
FIG. 7 shows a fabrication process G of the semiconductor device according to the first embodiment.

Then, as shown in FIG. 7, openings 12 and 13 for exposing respective source region 53, drain region 54, and gate electrode 9 of the first transistor Tr1, and openings 15 to 17 for exposing respective source region 55, drain region 56, and gate electrode 9 of the second transistor Tr2 are formed. The opening 12 exposes the surface of the source region 53, that is, the surface formed of silicide is exposed, and the exposed area is a source contact 18 that is electrically connected to outer wiring. In the same way, an area exposed by the opening 13 is a drain contact 19, an area exposed by the opening 15 is a source contact 20, and an area exposed by the opening 16 is a drain contact 21. After that, a not-shown wiring layer is formed and etched using the photolithography technique, thereby a gate wiring, source wiring, and drain wiring are formed, and then a protection layer is formed to cover each wiring.

Figure 8:
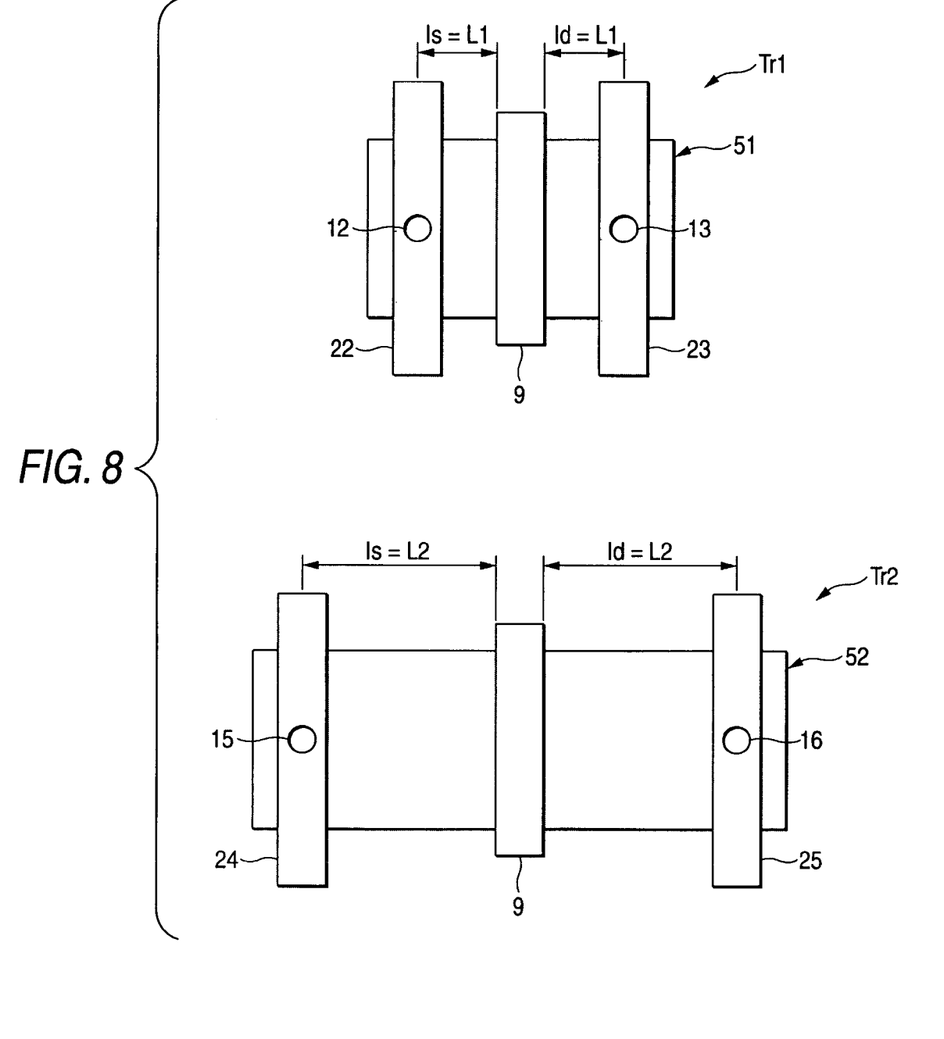
FIG. 8 is a plane view showing the first and the second transistors Tr1 and Tr2.

FIG. 8, which is a plane view showing the first and the second transistors Tr1 and Tr2, is intended to describe arrangement of the gate electrode, the source contact, and the drain contact. Here, a distance from the source contact to the gate electrode is denoted as a source contact distance is, and a distance from the drain contact to the gate electrode is denoted as a drain contact distance ld. In the figure, numerals 22 and 23 are the source wiring and drain wiring of the first transistor Tr1 respectively, and numerals 24 and 25 are the source wiring and drain wiring of the second transistor Tr2 respectively. In the embodiment, compared with the source contact distance is that is L1 and the drain contact distance ld that is L1 in the first transistor Tr1, the contact distances ls that is L2 and ld that is L2 in the second transistor Tr2 are formed largely. Here, L1 is 0.2 µm, and L2 is 10 µm. This controls the threshold voltage Vt2 of the second transistor Tr2 to be lower than the threshold voltage Vt1 of the first transistor Tr1.

Figure 9:
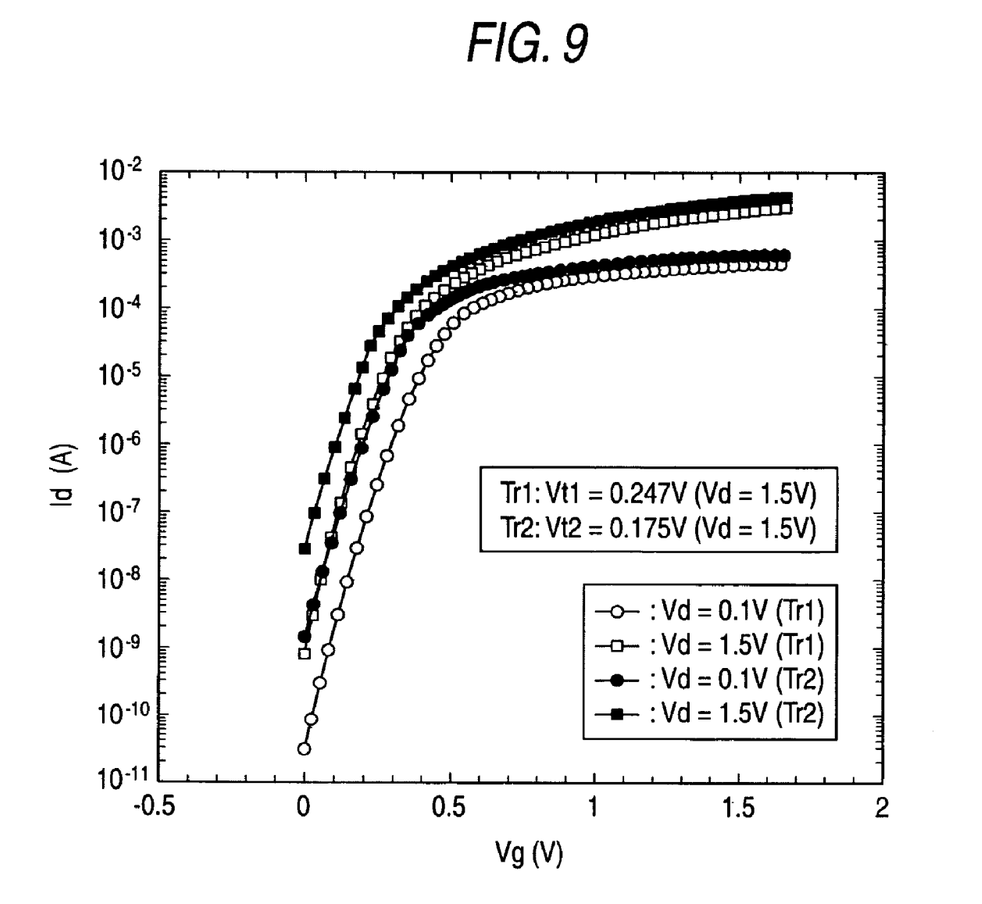
FIG. 9 is a view showing an example of measurements of the threshold voltage.

FIG. 9 is an example of measurements of the drain current versus gate voltage characteristic under the drain voltage Vd of 0.1 V or 1.5 V in the first and the second transistors Tr1 and Tr2. The ordinate shows the drain current Id where the unit is ampere [A] written in a logarithmic scale. The abscissa shows the gate voltage Vg where the unit is [A]. As shown in the figure, in each drain voltage Vd of 0.1 V or 1.5 V, Tr2 has a lower gate voltage Vg at which the drain current starts to increase. In the measurements in the case of Vd of 1.5 V, when the gate voltage value Vg at the drain current Id of about $10E^{-5}$ [A] is defined as the threshold voltage, the threshold voltage Vt1 of the first transistor Tr1 is 0.247 V and the threshold voltage Vt2 of the second transistor Tr2 is 0.175 V, that is, the threshold voltage Vt2 of the second transistor Tr2 is smaller than the threshold voltage Vt1 of the first transistor Tr1. The measurements clearly show that the threshold voltage Vt is decreased by increasing the contact distances ls and ld. Therefore, as the above fabrication method, the threshold voltage Vt can be controlled by changing the contact distances ls and ld, and the transistors having different threshold voltages Vt1 and Vt2 can be formed.

In the method in which the ion implantation density of the impurity into the active region is changed for each threshold voltage so that the transistors having different threshold voltages Vt1 and vt2 are formed in one chip, the mask is required for each threshold voltage, and also required for each of the P-type and the N-type transistors, therefore the number of masks twice as many as the number of the threshold voltages is required, and there have been problems of cost increase due to the increase of the masks, and increase of fabrication time and cost due to increase of the number of impurity ion implantation. On the contrary, when the threshold voltage Vt is controlled by changing the contact distances ls and ld as the embodiment, it is not necessary to prepare the mask and perform the ion implantation of the impurity for each threshold voltage Vt, therefore cost reduction can be designed by the decrease of masks, and reduction of the fabrication time and cost can be designed by the decrease of the number of ion implantation.

In the above, although a case where the first and the second transistors Tr1 and Tr2 having two types of the threshold voltages Vt1 and Vt2 are formed in one chip is described, according to the above fabrication method, transistors having three or more types of threshold voltages can be also formed.

(2) Second Embodiment

Although the threshold voltage Vt is controlled by changing both length of the contact distances ls and ld equally in the embodiment, the threshold voltage Vt can be also controlled by changing only the drain contact distance ld.

Figure 10:
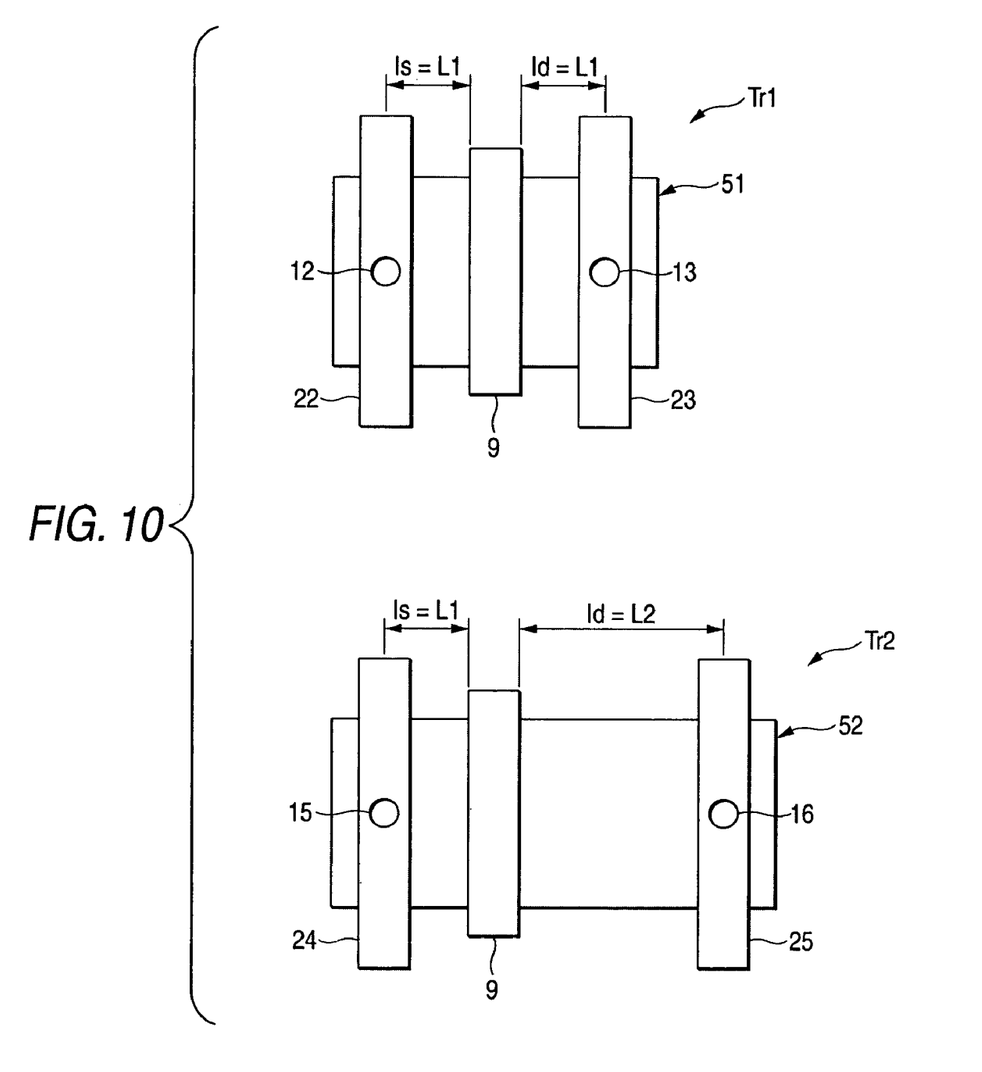
FIG. 10 is a plane view showing the first and the second transistors Tr1 and Tr2 according to the second embodiment.

FIG. 10 is a plane view of the first and the second transistors Tr1 and Tr2 in the case where the source contact distance ls is fixed and only the drain contact distance ld is changed. In the embodiment, as shown in the figure, both of the contact distances ls and ld of the first transistor Tr1 are L1, and the source contact distance is of the second transistor Tr2 is L1, and the drain contact distance ld is L2 (>L1). That is, only the contact distance ld of Tr2 is set to be L2 larger than L1. In this way, the source contact distance ls is formed fixedly and only the drain contact distance ld is formed largely, thereby, as the above embodiment, the threshold voltage Vt2 of Tr2 can be also made to be lower than the threshold voltage Vt1 of Tr1, and similar operation and effects as described above are obtained.

Although the case has been described above where the first and the second transistors having two types of threshold voltages Vt1 and Vt2 are formed in one chip, according to the fabrication method, the transistors having three or more types of threshold voltages can be also fabricated.

(3) Third Embodiment

Figure 11:
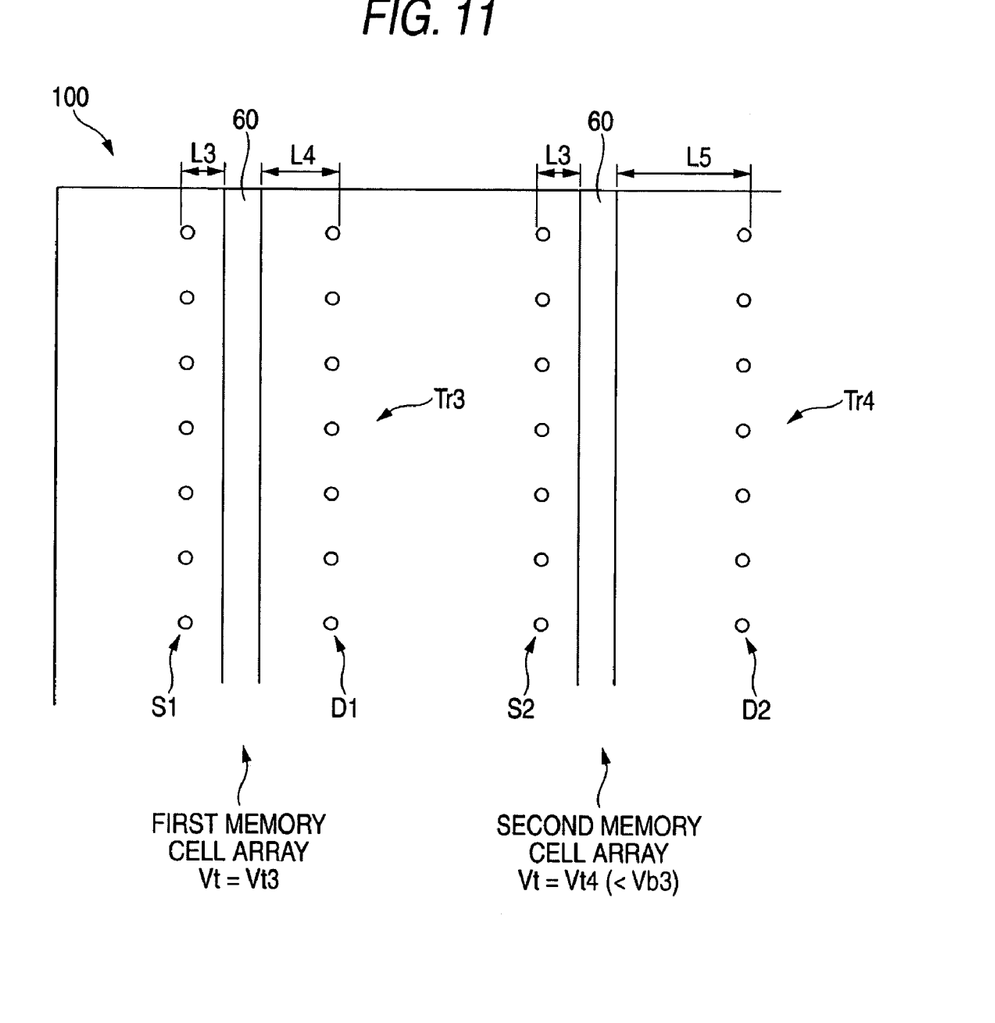
FIG. 11 is a plane view of a semiconductor memory device according to the third embodiment.

FIG. 11 is a plane view of the semiconductor device according to the third embodiment. In the embodiment, the semiconductor device is a semiconductor memory device comprising plural memory cell blocks. In the figure, numeral 60 is gate wiring, respective marks S1 and D1 are the source contact and drain contact of the first transistor Tr1, and respective marks S2 and D2 are the source contact and drain contact of the second transistor Tr2.

In the embodiment, in each memory cell block 100, the threshold voltage Vt of the transistor is different for each memory cell array along a direction of the gate wiring 60 (column direction). That is, the threshold voltage of the third transistor Tr3 in the first memory cell array is Vt3, and the threshold voltage of the fourth transistor Tr4 in the second memory cell array is Vt4. In a specific configuration, as shown in the figure, the contact distance is of the third transistor Tr3 forming the first memory cell array is set to be L3, and the contact distance ld is set to be L4 larger than L3. On the other hand, the contact distance ls of the fourth transistor Tr4 forming the second memory cell array is set to be L3 equal to the contact distance is of the third transistor Tr3, and the contact distance ld is set to be L5 larger than L4. These transistors can be formed in the same manner as the fabrication method of the first embodiment.

The contact distance ld of the fourth transistor Tr4 is set to be L5 larger than the contact distance L4 of the third transistor Tr3 in this manner, thereby the threshold voltage Vt4 of the fourth transistor Tr4 can be controlled to be lower than the threshold voltage Vt3 of the third transistor Tr3. This makes it possible to form the transistors having threshold voltages Vt3 and Vt4 that are different from each other for each column (between the first memory cell array and the second memory cell array). Moreover, in the semiconductor memory device, the transistors having plural threshold voltages Vt3 and Vt4 can be formed in a simple method as the fabrication method of the first embodiment. Here, two types of threshold voltages Vt3 and Vt4 are described as an example, however, the transistors can be formed such that there are three or more types of threshold voltages for each column in one memory cell block 100.

Figure 12:
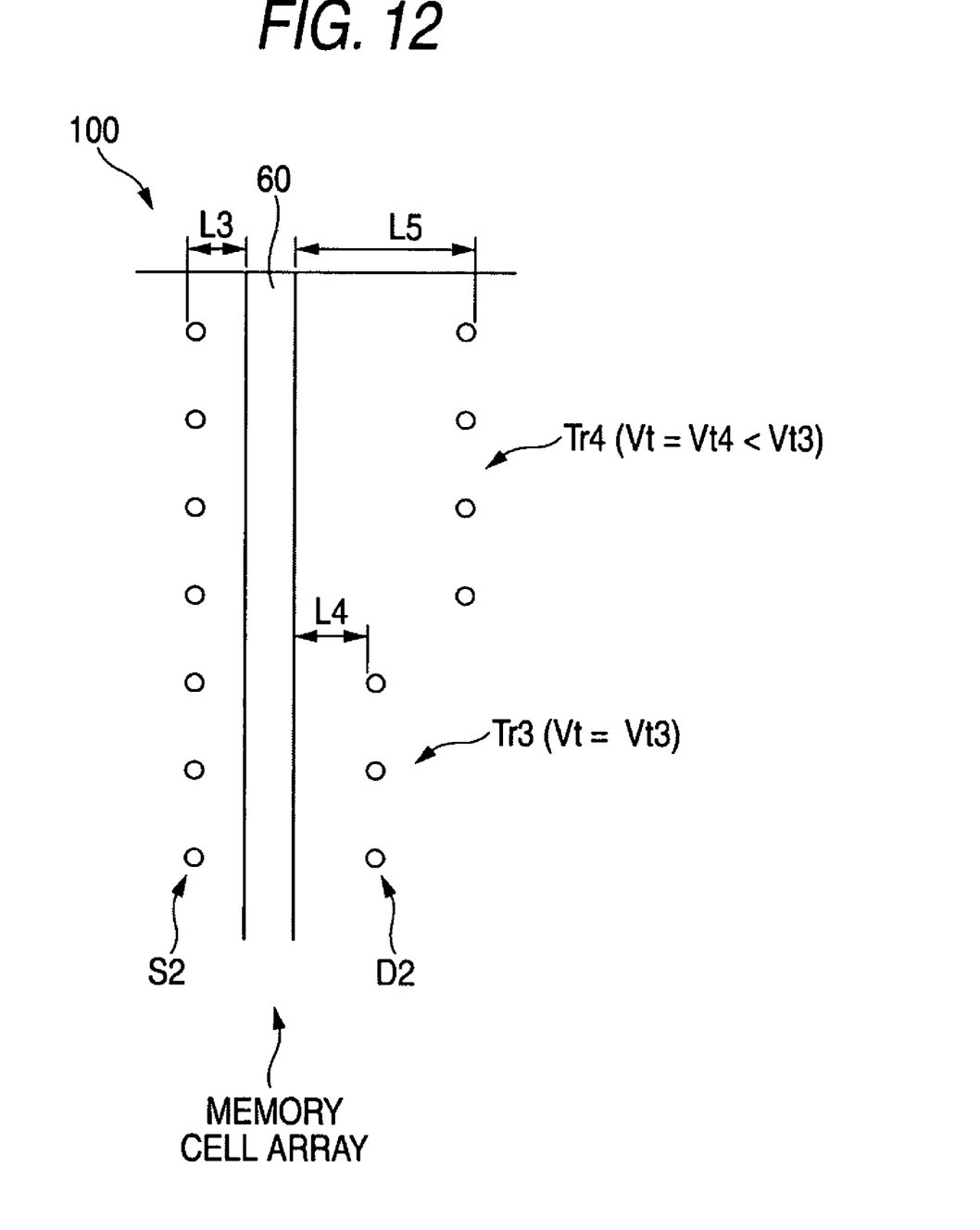
FIG. 12 is a plane view of a semiconductor memory device according to the fourth embodiment.
Figure 13:
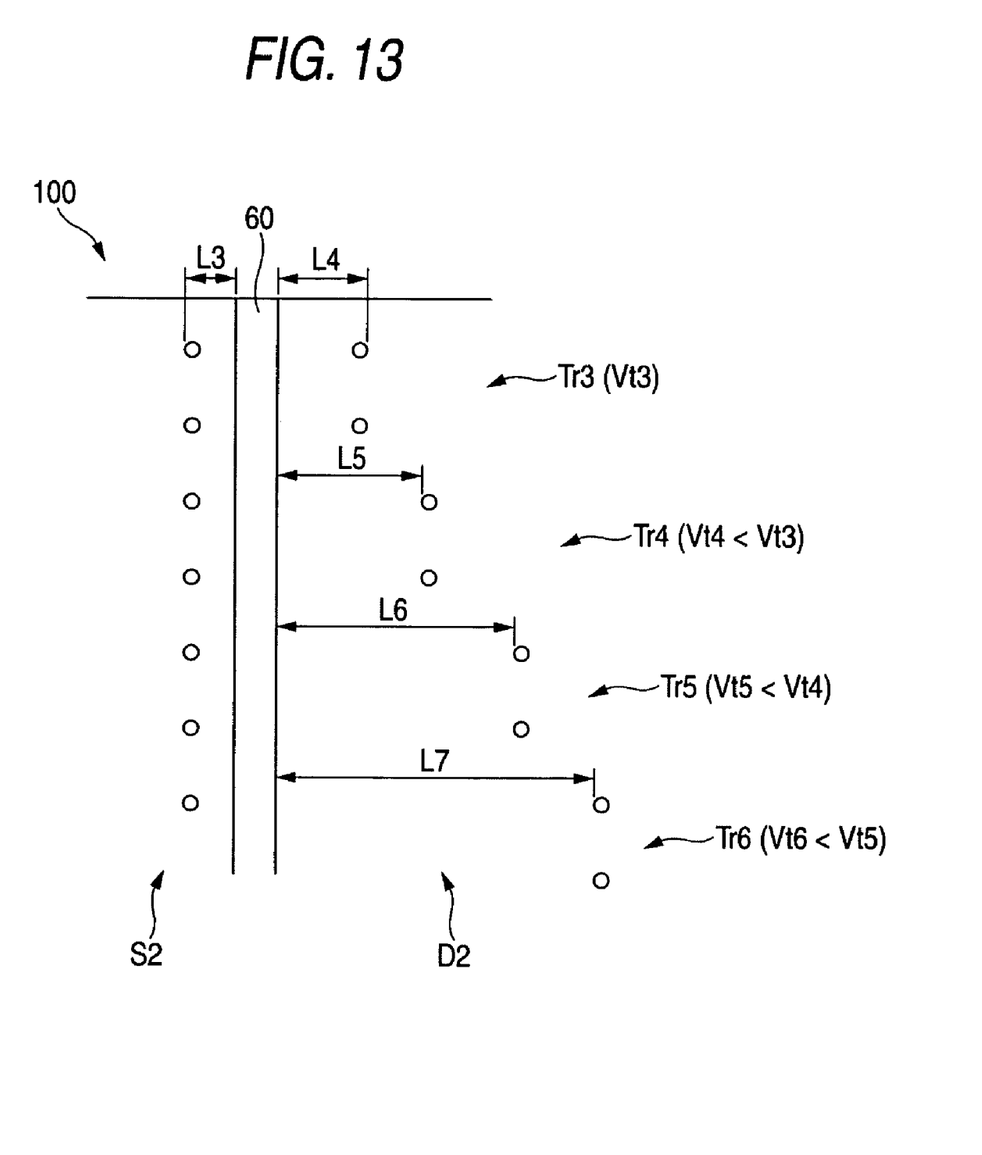
FIG. 13 is a plane view of a semiconductor memory device according to the fourth embodiment.

The transistors within the same memory cell block have been described above, however, not limited to those within the same memory cell block, the transistors can be also formed to have different threshold voltages for each column (4) Fourth Embodiment FIG. 12 and FIG. 13 are plane views of the semiconductor devices according to the fourth embodiment. In the embodiment, the semiconductor device is a semiconductor memory device. In the semiconductor memory device, transistors having plural threshold voltages Vt are formed in the same memory cell array.

In the case of FIG. 12, the third transistor Tr3 having the contact distances ls that is L3 and ld that is L4, and the fourth transistor Tr4 having the contact distances ls that is L3 and ld that is L5 are formed. That is, the contact distance L5 of the fourth transistor Tr4 is made to be larger than the contact distance L4 of the third transistor Tr3. In this way, the third transistor Tr3 having the threshold voltage Vt3 and the fourth transistor Tr4 having the threshold voltage Vt4 lower than Vt3 are formed in the same memory cell array. The drain contact distances ld of the transistors in the same memory cell array are changed in this manner, thereby the transistors having plural threshold voltages Vt in the same memory cell array can be formed.

In the semiconductor memory device, the transistors having plural threshold voltages Vt can be formed in a simple method as the fabrication method of the first embodiment. Although two types of threshold voltages Vt3 and Vt4 are described in FIG. 12, the transistors can be formed such that they have three or more types of threshold voltages.

In the case of FIG. 13, the transistors are formed in the same memory cell array such that the contact distance ld of the transistor increases in order of L4, L5, L6, and L7. In this case, the transistors Tr3, Tr4, Tr5, and Tr6 can be formed such that those thresholds decrease in order, for example, Vt3>Vt4>Vt5>Vt6 . . . . For example, when the transistors are formed such that the threshold voltage Vt of the transistor becomes lower in a memory cell more distant from a column decoder, shift of conducting timing at each memory cell, which is caused by signal delay depending on length of a column selecting line, can be suppressed.

In the semiconductor memory device, the transistors having plural threshold voltages Vt can be formed in a simple method as the fabrication method of the first embodiment.

(5) Other Embodiments

Although the transistors having different threshold voltages are formed in the same memory cell block in the third and the fourth embodiments, the transistors can be formed such that all of them have the same threshold voltage in the same memory cell block, and the transistors have different threshold voltages among respective memory cell blocks.

Also, when the method in which the threshold voltages are controlled by changing the contact distance ld as above is used, any transistor forming the semiconductor memory device can be easily controlled to have a desired threshold voltage.

According to the invention, since the threshold voltage is controlled by changing the distance between the drain contact and the gate electrode, it is not necessary to prepare the mask for each threshold voltage and perform the impurity implantation for controlling the threshold, and thus the threshold voltage can be easily controlled, and the fabrication time and cost of the semiconductor device can be reduced.

What is claimed is:

1. A method for fabricating a semiconductor device in which plural transistors including a first transistor and a second transistor are integrated, the method comprising;
   a first step for forming the first transistor such that a distance between a drain contact and a gate electrode of the first transistor is a first distance; and
   a second step for forming the second transistor such that a distance between a drain contact and a gate electrode of the second transistor is a second distance larger than the first distance;
   wherein the semiconductor device is a semiconductor memory device and each of the first and the second transistors is a transistor forming a memory cell.

2. The method for fabricating the semiconductor device according to claim 1,
   wherein, in the first step, the first transistor is formed such that a distance between a source contact and the gate electrode of the first transistor is a third distance, and, in the second step, the second transistor is formed such that a distance between a source contact and the gate electrode of the second transistor is a fourth distance larger than the third distance.

3. The method for fabricating the semiconductor device according to claim 1,
   wherein, in the first step, the first transistor is formed such that a distance between a source contact and the gate electrode of the first transistor is a third distance, and, in the second step, the second transistor is formed such that a distance between a source contact and the pate electrode of the second transistor is a fourth distance, wherein the first distance is almost equal to the third distance and the second distance is almost equal to the fourth distance.

4. The method for fabricating the semiconductor device according to claim 1, wherein the first and the second transistors are MOS transistors in which surfaces of source and drain regions are formed of silicide.

5. The method for fabricating the semiconductor device according to claim 1, wherein the first and the second transistors are formed in a semiconductor layer on an SOI substrate.

6. The method for fabricating the semiconductor device according to claim 1, wherein the first and the second transistors are arranged along different columns.

7. The method for fabricating the semiconductor device according to claim 1, wherein the first and the second transistors are arranged along the same column.

8. A method of fabricating a semiconductor device in which plural transistors including a first transistor and a second transistor are integrated, the method comprising:
   a first step for forming the first transistor such that a distance between a drain contact and a gate electrode of the first transistor is a first distance; and
   a second step for forming the second transistor such that a distance between a drain contact and a gate electrode of the second transistor is a second distance larger than the first distance;
   wherein the semiconductor device has a digital circuit and an analog circuit, and the first and the second transistors are contained in the digital circuit and the analog circuit, respectively.

9. The method for fabricating the semiconductor device according to claim 8,
   wherein, in the first step, the first transistor is formed such that a distance between a source contact and the gate electrode of the first transistor is a third distance, and, in the second step, the second transistor is formed such that a distance between a source contact and the gate electrode of the second transistor is a fourth distance larger than the third distance.

10. The method for fabricating the semiconductor device according to claim 8,
    wherein, in the first step, the first transistor is formed such that a distance between a source contact and the gate electrode of the first transistor is a third distance, and, in the second step, the second transistor is formed such that a distance between a source contact and the gate electrode of the second transistor is a fourth distance, wherein the first distance is almost equal to the third distance and the second distance is almost equal to the fourth distance.

11. The method for fabricating the semiconductor device according to claim 8,
    wherein the first and the second transistors are MOS transistors in which surfaces of source and drain regions are formed of silicide.

12. The method for fabricating the semiconductor device according to claim 8,
    wherein the first and the second transistors are formed in a semiconductor layer on an SOI substrate.

* * * * *